US009969551B2

(12) United States Patent
Abe et al.

(10) Patent No.: US 9,969,551 B2
(45) Date of Patent: May 15, 2018

(54) ARTICLE TRANSPORT FACILITY

(71) Applicant: Daifuku Co., Ltd., Osaka-shi (JP)

(72) Inventors: Takeshi Abe, Shiga (JP); Atsushi Fujiwara, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 139 days.

(21) Appl. No.: 14/937,101

(22) Filed: Nov. 10, 2015

(65) Prior Publication Data
US 2016/0130083 A1 May 12, 2016

(30) Foreign Application Priority Data

Nov. 12, 2014 (JP) ................................ 2014-230061

(51) Int. Cl.
*B65G 1/04* (2006.01)
*H01L 21/677* (2006.01)

(52) U.S. Cl.
CPC ...... *B65G 1/0407* (2013.01); *H01L 21/67769* (2013.01); *H01L 21/67775* (2013.01); *B65G 2201/0297* (2013.01); *Y10S 414/14* (2013.01)

(58) Field of Classification Search
USPC .......................... 294/99.1, 902; 414/785, 940
See application file for complete search history.

(56) References Cited

U.S. PATENT DOCUMENTS 9,536,766 B2 * 1/2017 Kinugawa .......... H01L 21/67379
9,576,832 B2 * 2/2017 Tomida ............... H01L 21/6773
9,640,417 B2 * 5/2017 Yuk ................... H01L 21/67379
2012/0315113 A1 12/2012 Hiroki
2014/0093336 A1 4/2014 Hiroki

FOREIGN PATENT DOCUMENTS

| GB | 651714 A | * 4/1951 | ............... B66F 9/18 |
|---|---|---|---|
| JP | 5301611 A | 11/1993 | |
| JP | 6156628 A | 6/1994 | |
| JP | 724813 U | 5/1995 | |
| JP | 2001348104 A | 12/2001 | |
| JP | 2003128209 A | 5/2003 | |
| JP | 2004103924 A | 4/2004 | |
| JP | 200649454 A | 2/2006 | |
| JP | 2009137368 A | 6/2009 | |
| WO | 2011096208 A1 | 8/2011 | |

* cited by examiner

*Primary Examiner* — James Keenan
(74) *Attorney, Agent, or Firm* — The Webb Law Firm

(57) ABSTRACT

An article transport device includes a vertically movable member which is movable along the vertical direction, and a transfer device which is supported by the vertically movable member and is configured to transfer an article to or from any one of transfer target locations. The transfer device includes a support body which receives and supports an article and is projected and retracted between a projected position and a retracted position. And the support body includes a support member which is elastically deformable in the vertical direction, wherein the support body is configured to receive and support an article with the support member. A cushion member is provided to the vertically movable member such that the cushion member is spaced apart upwardly by a set distance from the article which is received and supported by the support member.

19 Claims, 5 Drawing Sheets

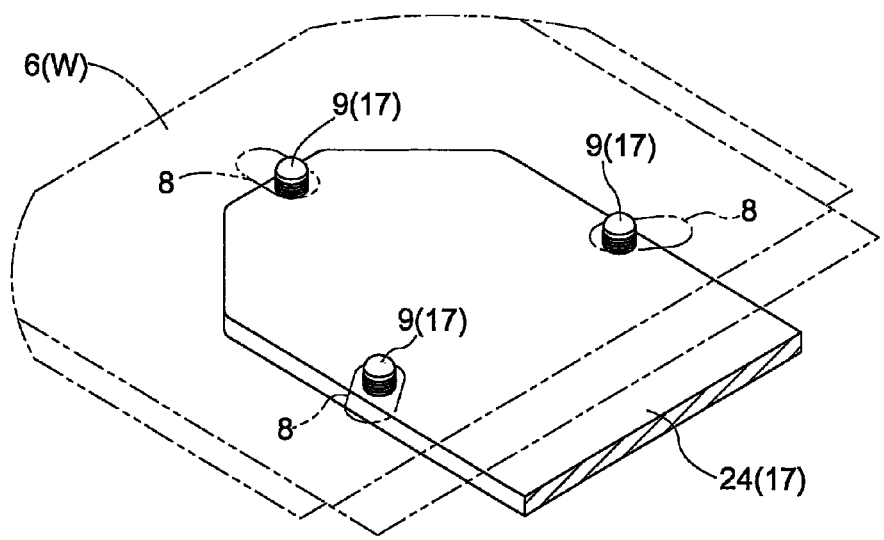
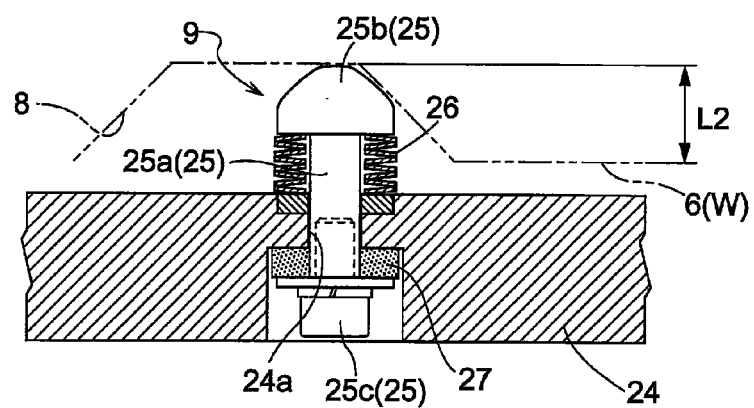
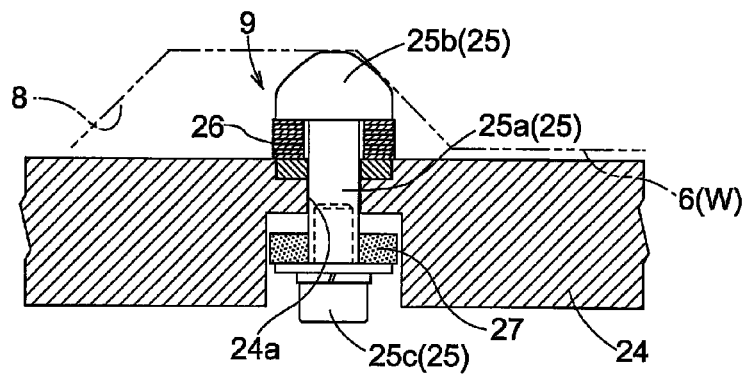

ARTICLE TRANSPORT FACILITY

CROSS-REFERENCE TO RELATED APPLICATION

This application claims priority to Japanese Patent Application No. 2014-230061 filed Nov. 12, 2014, the disclosure of which is hereby incorporated in its entirety by reference.

FIELD OF THE INVENTION

The present invention relates to an article transport facility comprising an article transport device for transporting articles among a plurality of transfer target locations arranged in a vertical direction.

BACKGROUND ART

JP Publication of Application No. H06-156628 (Patent Document 1) describes an example of an article transport facility having an article transport device for transporting articles among a plurality of transfer target locations arranged in the vertical direction. This article transport device includes a vertically movable member which is raised and lowered along the vertical direction, and a transfer device which is supported by the vertically movable member and which transfers an article between itself and transfer target locations. The transfer device includes a support body for receiving and supporting an article, and a projecting and retracting actuator which causes the support body to be projected and retracted between a projected position in which the support body is projected toward the transfer target location and a retracted position in which the support body is retracted toward the vertically movable member.

In the article transport facility of Patent Document 1, the vertically movable is provided with a cushion member which is elastically deformable in the vertical direction. The cushion member is located above the article received and supported by the support members of the fork mechanism (9). More specifically, the cushion member has a spring (16a) interposed between a load stabilizer (11) and a press plate (15) so that the cushion member is elastically deformable in the vertical direction. In addition, the cushion member is configured to be vertically movable between a pressing position in which the cushion member presses down on the article received and supported by the support members of the fork mechanism (9), and an away position in which the cushion member is spaced apart upwardly from the article received and supported by the support members of the fork mechanism (9).

For example, when the vertically movable member is moved vertically, the article can be pressed down on by the cushion member by lowering the cushion member to the pressing position. This prevents the article from being lifted off from the support members, thus reducing the possibility of the article falling from the transfer device. The article tends to be lifted off from the support members due to an upward inertial force especially when the vertically movable member is abruptly stopped during its ascent. However, lifting off of the article can be prevented if the article is pressed down on from above by the cushion member. Therefore, the possibility of the article falling from the transfer device can be reduced even when the vertically movable member makes an emergency stop. In addition, when the support body of the transfer device is projected or retracted to transfer an article to or from a transfer target location, the cushion member can be raised to the retracted position so that the article being transferred would not interfere with the cushion member.

However, in the article transport facility of Patent Document 1, the cushion member needs be raised to the retracted position in order to release the pressing down on the article by the cushion member before transferring (i.e., delivering) the article by the transfer device. In addition, after the transfer (receiving) of an article is completed by the transfer device, the cushion member needs be lowered to the pressing position in order to press down on the article with the cushion member. Thus, since it is necessary to vertically move the cushion member before and after a transferring of an article with the transfer device, somewhat complicated operation needs to be performed in the transfer process.

SUMMARY OF THE INVENTION

Problems to be Solved by the Invention

To this end, an article transport facility is desired in which it is easy to transfer articles smoothly with the transfer device while preventing a fall of the article from the transfer device.

Means for Solving the Problems

In one embodiment, in light of the above, an article transport facility comprises an article transport device for transporting articles among a plurality of transfer target locations arranged in a vertical direction wherein the article transport device includes a vertically movable member which is movable along the vertical direction, and a transfer device which is supported by the vertically movable member and is configured to transfer an article to or from any one of the transfer target locations,
wherein the transfer device includes a support body for receiving and supporting an article, and a projecting and retracting actuator for projecting and retracting the support body between a projected position in which the support body is projected toward the any one of the transfer target location and a retracted position in which the support body is retracted toward the vertically movable member,
wherein the support body includes a support member which is elastically deformable in the vertical direction, wherein the support body is configured to receive and support an article with the support member, and
wherein a cushion member which is elastically deformable in the vertical direction is provided to the vertically movable member such that the cushion member is spaced apart upwardly by a set distance from an article which is received and supported by the support member.

With the arrangement described above, even when the article is lifted from the support member, the lifted article is received in a cushion member; thus, lifting of the article by more than a set distance can be prevented. Thus, the article can be prevented from falling from the support member by reducing the lifting of the article from the support member in this manner. In addition, since the cushion member is configured to be elastically deformable in the vertical direction, any shock or impact that may occur when the article is received by the cushion member can be alleviated. And although the article received by the cushion member subsequently falls on the support member due to gravity, any shock or impact that may occur when the article is received by the support member can be alleviated because the support member which receive the article are configured to be elastically deformable in the vertical direction.

In addition, the cushion member is spaced apart upwardly by the set distance from the article received and supported by the support member. In other words, space or a gap is provided so that the article would not contact the cushion member; thus, when transferring the article with the transfer device, the article can be transferred while any contact between the article and the cushion member is avoided without having to retract the cushion member upwardly. As such, it becomes easy to smoothly perform transfer of an article with transfer device since the article can be transferred with the transfer device without having to vertically move the cushion member, while preventing the article from falling from the support member by preventing a lifting of the article by more than the set distance.

Additional features and advantages of the article transport facility will become clear from the following descriptions about the embodiment described with reference to the drawings.

BRIEF DESCRIPTION OF THE DRAWINGS

FIG. 2 is a partial cut-out perspective view of a support body of a transfer device, FIG. 3 is a side view showing a positioning member that is supporting a container, FIG. 4 is a side view showing the positioning member depressed or compressed further from its position where it supports the container.

DETAILED DESCRIPTION

Figure 1:
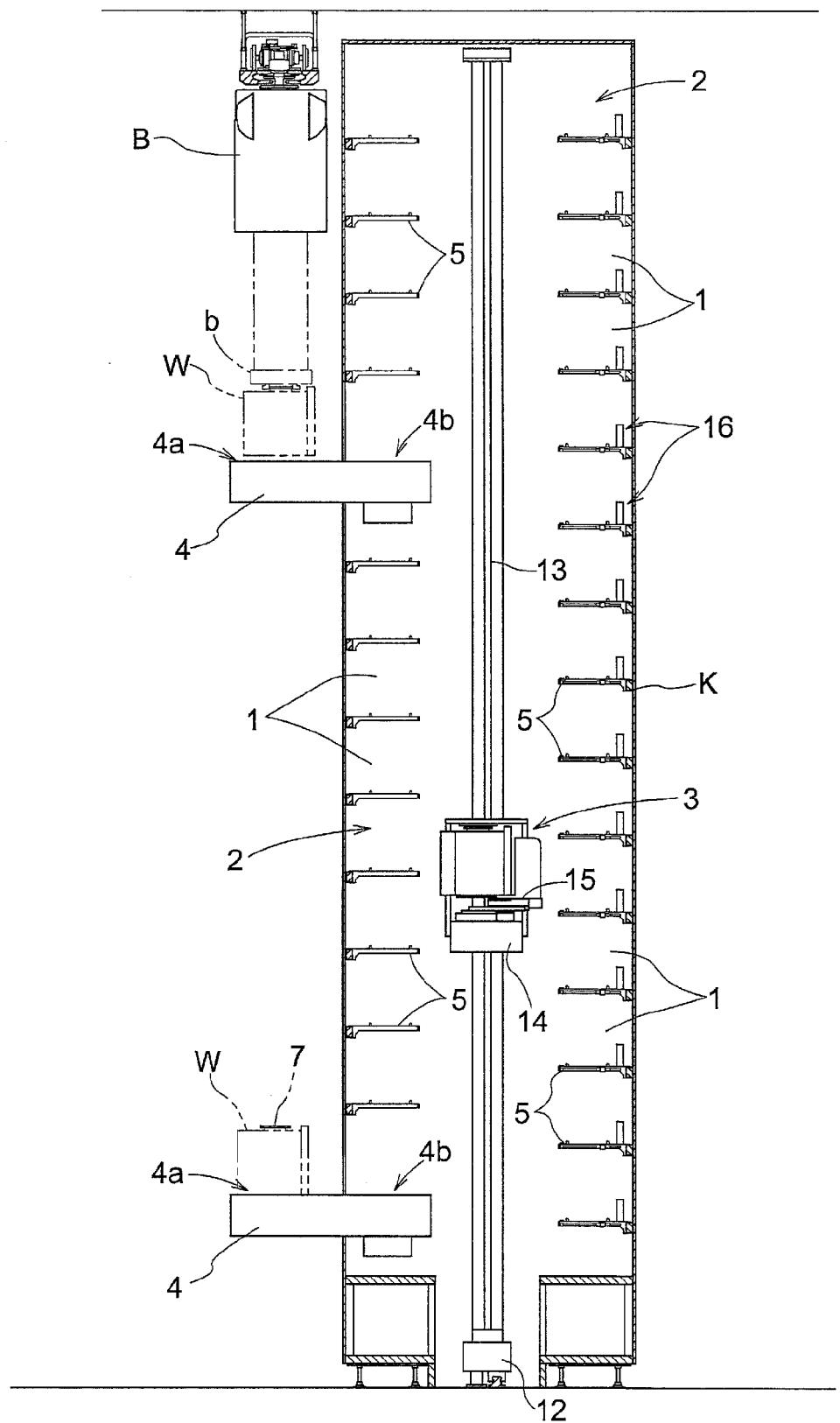
FIG. 1 is a front view of an article transport facility.

Embodiments of an article transport facility are described next with reference to the drawings. As shown in FIG. 1, the article transport facility includes article storage racks 2 each having a plurality of storage sections 1 for storing containers W which are the articles, a stacker crane 3 for transporting the containers W one container at a time, walls K for covering installation space in which the article storage rack 2 and the stacker crane 3 are installed, and carry-in-and-out conveyors 4 which are arranged to extend through a wall K for supporting and transporting the containers W.

A pair of article storage racks 2 are provided such that they facing each other with a mast 13 of the stacker crane 3 located between them. Each of the pair of article storage racks 2 has a plurality of storage sections 1 that are arranged both in the vertical direction and in a rack lateral direction (i.e., direction perpendicular to the paper of FIG. 1). Each of the plurality of storage sections 1 includes a receiving member 5 for receiving and supporting a container W being stored. Note that one of the pair of article storage racks 2 (the article storage rack 2 on the right in FIG. 1) is provided with nitrogen gas supplying devices 16 for supplying nitrogen gas, as inactive gas, to the containers W stored in the storage sections 1.

Each carry-in-and-out conveyor 4 is configured to support and transport the container W between an external transfer location 4a located on the outside of a wall K and an internal transfer location 4b located inside the wall K. A ceiling, or overhead, transport vehicle B loads and unloads the container W to and from the external transfer location 4a of the carry-in-and-out conveyor 4 installed at a higher position whereas a human worker loads and unloads the container W to and from the external transfer location 4a of the carry-in-and-out conveyor 4 installed at a lower position.

When a container W is placed on the external transfer location 4a of the carry-in-and-out conveyor 4, the container W is supported and transported from the external transfer location 4a to the internal transfer location 4b by the carry-in-and-out conveyor 4, and is transported from the internal transfer location 4b to one of the storage sections 1 by the stacker crane 3. (This operation will be referred to as a carry-in operation.) Conversely, in the article transport facility, when a container W is transported from a storage section 1 to the internal transfer location 4b of the carry-in-and-out conveyor 4 by the stacker crane 3, the container W is supported and transported from the internal transfer location 4b to the external transfer location 4a by the carry-in-and-out conveyor 4, and is taken away from the external transfer location 4a by the ceiling transport vehicle B or by a worker. (This operation will be referred to as a carry out operation.) As such, the stacker crane 3 transports containers W between the internal transfer locations 4b and the storage sections 1, one container at a time. Note that internal transfer locations 4b and the storage sections 1 are, or correspond to, transfer target locations. And the stacker crane 3 is, or corresponds to, the article transport device for transporting an article among a plurality of transfer target locations arranged in the vertical direction.

Figure 5:
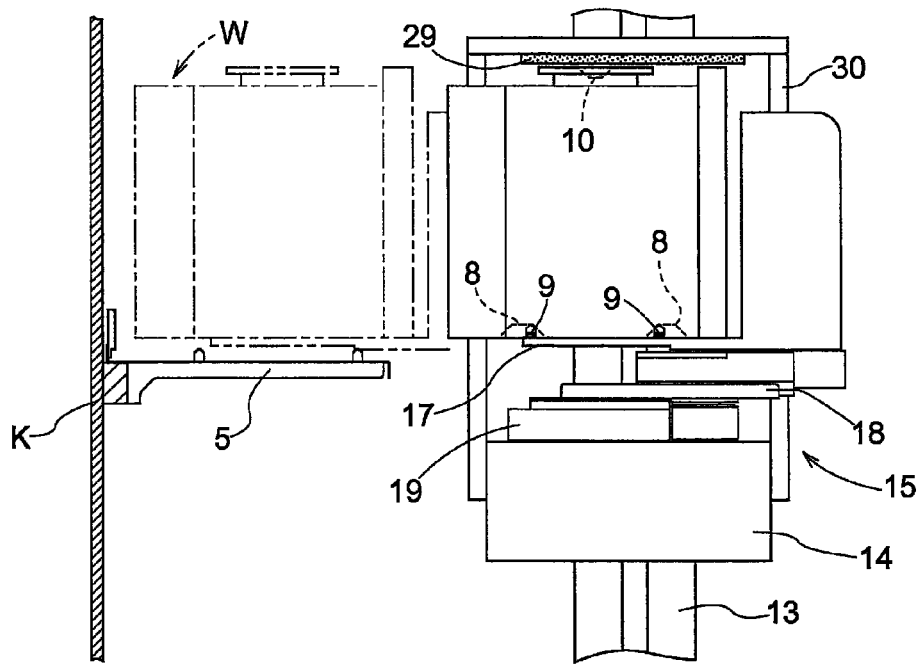
FIG. 5 is a front view showing a vertically movable member stopped at a unloading vertical stop position.
Figure 6:
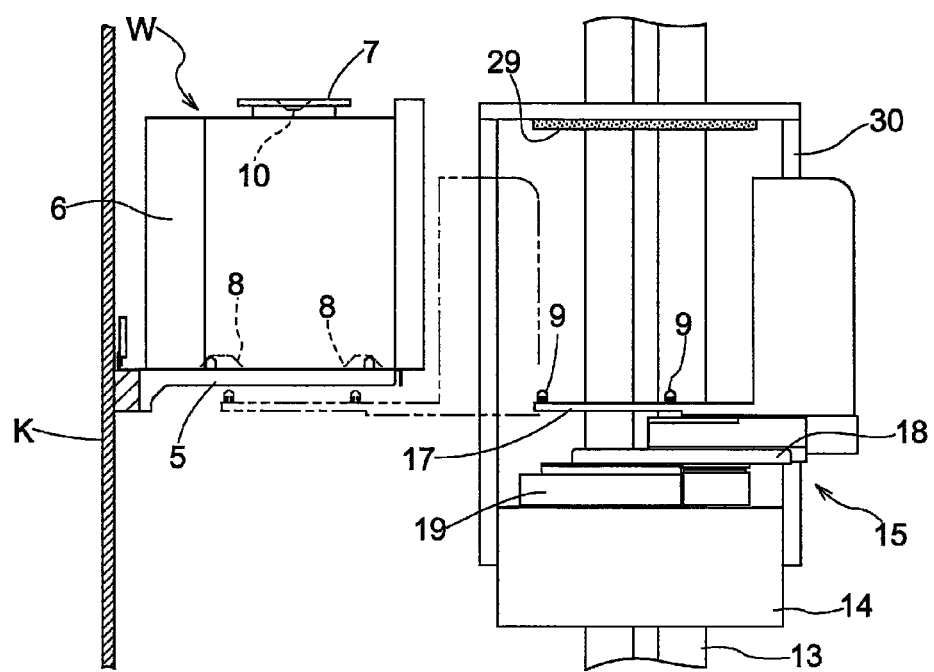
FIG. 6 is a front view showing a vertically movable member stopped at a pick up vertical stop position.

As shown in FIGS. 5 and 6, the container W includes a container main body portion 6 for holding a plurality of semiconductor substrates, a flange portion 7 which is located above the container main body portion 6 and is provided to an upper end portion of the container W, and a detachable lid (not shown) for closing a substrate entrance, or an opening, formed in the front face of the container main body portion 6 for inserting and retrieving the substrates. As shown in FIGS. 5 and 6, the stacker crane 3 is configured to transport a container W while receiving and supporting the bottom portion of the container main body portion 6. And as shown in FIG. 1, the ceiling transport vehicle B is configured to transport a container W while suspending and supporting the flange portion 7. Note that, in present embodiment, the container W (article) is a FOUP (Front Opening Unified Pod) for holding semiconductor substrates.

As shown in FIGS. 2, 5, and 6, three bottom surface recessed portions 8, each of which is recessed upwardly and extends radially, are provided to or formed in the bottom surface of the container main body portion 6 (i.e., in the bottom surface of the container W). Each bottom surface recessed portion 8 is formed to taper toward its upper end, and is formed such that its inner surfaces are sloped. These bottom surface recessed portions 8 are provided such that, when the container W at an internal transfer location 4b or in a storage section 1 is picked up by the support body 17 of the transfer device 15 of the stacker crane 3, the bottom surface recessed portions 8 are engaged from below by positioning members 9 provided to the support body 17. When the container W is picked up by the support body 17 of the transfer device 15, the positioning members 9 provided to the support body 17 are guided by the inner surfaces of the bottom surface recessed portions 8 if the container W is displaced horizontally relative to the support body 17. This allows and causes the position of the container W in the horizontal direction relative to the support body 17 to be corrected to its proper position. Note that each bottom surface recessed portions 8 is, or corresponds to, the recessed portion formed to have a shape which is recessed upwardly in the undersurface of the article.

As shown in FIGS. 5 and 6, a top surface recessed portion 10 which is recessed downwardly is formed in the top surface of the flange portion 7 (i.e., in the top surface of the container W). The top surface recessed portion 10 is formed to taper toward its lower end and is formed such that its inner surfaces are sloped. The top surface recessed portion 10 is configured such that, when the ceiling transport vehicle B lowers the support mechanism b while the container W is placed at an external transfer location 4a, a pressing portion provided to the support mechanism b engages the top surface recessed portion 10. And as shown in FIG. 1, if the support mechanism b is displaced horizontally relative to the container W received and supported by the support platform 1a when the ceiling transport vehicle B lowers the support mechanism b, the pressing portion is guided by the inner surfaces of the top surface recessed portion 10. This allows and causes the position of the support mechanism b in the horizontal direction relative to the container W to be corrected to its proper position. Note that the rest of the portions, other than the top surface recessed portion 10, of the top surface of the flange portion 7 is formed to be a flat surface. The remaining portion, other than the top surface recessed portion 10, of the top surface of the flange portion 7 is, or corresponds to, the uppermost surface of the container W.

Figure 10:
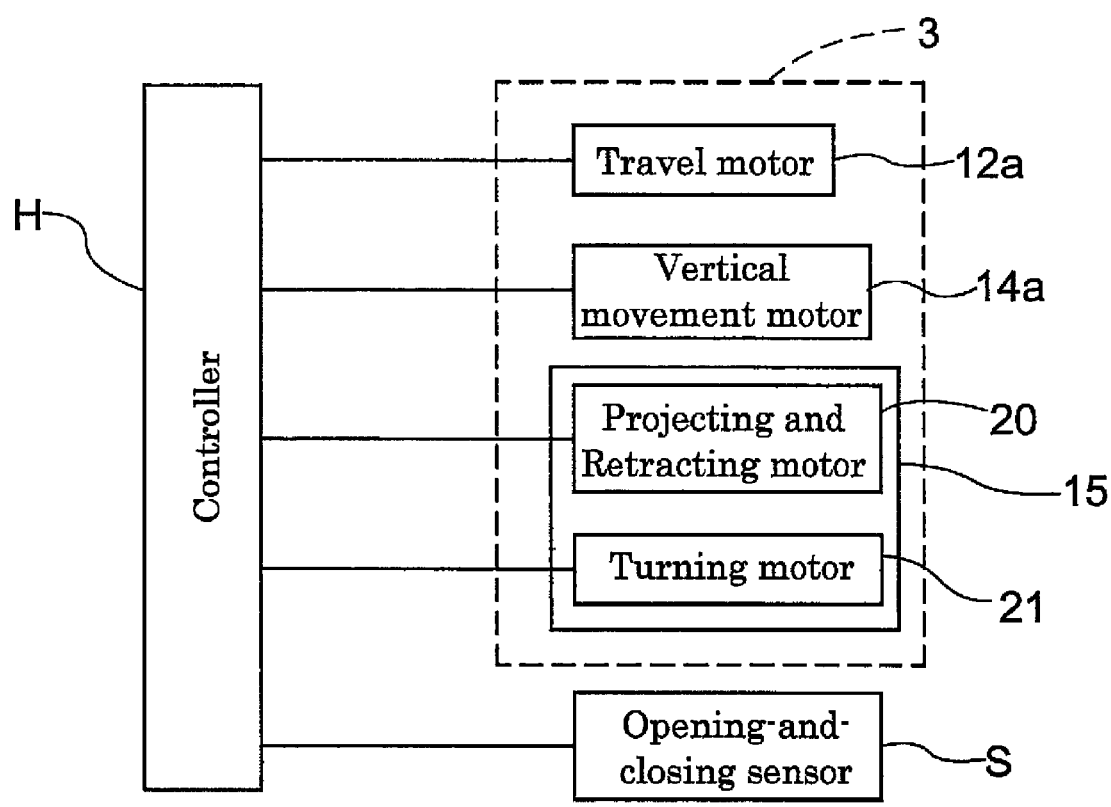
FIG. 10 shows a control block diagram.

As shown in FIG. 1, the stacker crane 3 includes a travel carriage 12 configured to travel along a travel path defined between the pair of article storage racks 2 along a rack lateral direction, the vertically movable member 14 which is movable vertically along a mast 13 provided to stand erect on the travel carriage 12, and the transfer device 15 which is supported by the vertically movable member 14 and is configured to transfer a container W between itself and any one of the storage sections 1 and any one of the internal transfer locations 4b. The stacker crane 3 is configured such that the travel carriage 12 travels by the driving force of a travel motor 12a (see FIG. 10), such that the vertically movable member 14 is vertically moved by the driving force of a vertical movement motor 14a (see FIG. 10), and such that a container W is transported between any one of the internal transfer locations 4b and any one of the storage sections 1 through operation of the transfer device 15.

As shown in FIGS. 5 and 6, the transfer device 15 includes the support body 17 for receiving and supporting a container W, a linkage mechanism 18 for horizontally moving the support body 17, a rotatable platform 19 to which a base portion of the linkage mechanism 18 is connected, a projecting and retracting motor 20 (see FIG. 10) for extending and contracting the linkage mechanism 18 to project and retract the support body 17, and a turning motor 21 (see FIG. 10) for rotating the rotatable platform 19 about a vertical axis.

The support body 17 is moved along a projecting and retracting direction by causing the linkage mechanism 18 to extend and contract through the driving force or actuation of the projecting and retracting motor 20. The support body 17 is projected and retracted through movement along the projecting and retracting direction between a retracted position (position shown with solid lines in FIGS. 5 and 6) in which the support body 17 is retracted toward the vertically movable member 14 a projected position (position shown with dashed lines in FIGS. 5 and 6) in which the support body 17 is projected toward a storage section 1. Note that the projecting and retracting motor 20 is, or corresponds to, the projecting and retracting actuator for causing the support body 17 to be projected and retracted between the projected position and the retracted position.

In addition, by rotating the rotatable platform 19 with the drive force of the turning motor 21 to cause the support body 17 and the linkage mechanism 18 to turn about the vertical axis, the orientation of the transfer device 15 is switched, or changed, between an orientation in which the transfer device 15 faces one of the pair of article storage racks 2 and an orientation in which the transfer device 15 faces the other of the pair of article storage racks 2. By switching or changing the orientation of the transfer device 15 as described above, the direction along which the support body 17 is projected can be switched, or changed, between a direction in which one of the pair of article storage racks 2 exists and a direction in which the other of the pair of the article storage racks 2 exists.

A controller H which controls the operation of the stacker crane 3 is described next. The stacker crane 3 is supported by the travel carriage 12 which is configured to travel on rails installed on the ground and is movable along the rack lateral direction. For the stacker crane 3 (or the travel carriage 12 in particular), a travel stop position which defines a position in the rack lateral direction is defined in advance for each of the plurality of the storage sections 1 and for each of the plurality of the internal transfer locations 4b. In addition, for the stacker crane 3 (or the transfer device 15 in particular), a pick up vertical stop position (see FIG. 6) which defines a position in the vertical direction is defined in advance for each of the plurality of the storage sections 1 and for each of the plurality of the internal transfer locations 4b. In addition, an unloading vertical stop position (see FIG. 5) which is higher than the corresponding pick up vertical stop position by a set amount is also defined in advance. Information on the travel stop positions, information on pick up vertical stop positions, and information on unloading vertical stop positions are stored in the controller H.

As shown in FIG. 6, when the vertically movable member 14 is located at the height of the pick up vertical stop position, the support body 17 is located downwardly of, or at a lower height than, the receiving member 5. As shown in FIG. 5, when the vertically movable member 14 is located at the height of the unloading vertical stop position, the support body 17 is located upwardly of, or at a higher height than, the receiving member 5.

The controller H designates a storage section 1 or an internal transfer location 4b to be the transport origin or the transport destination, and performs an article transport control when a transport command for transporting a container W from the transport origin to the transport destination is issued by a superordinate managing device (not shown). In this article transport control, a pick up travel control, a pick up transfer control, an unloading travel control, and an unloading transfer control are performed in that order.

In the pick up travel control, the controller H controls the operation of the travel motor 12a to cause the travel carriage 12 to travel to the travel stop position that corresponds to the transport origin, and controls the operation of the vertical movement motor 14a to vertically move the vertically movable member 14 to the pick up vertical stop position that corresponds to the transport origin. In addition, if and when the transfer device 15 is not in the orientation in which the transfer device 15 faces the transport origin, the controller H controls the operation of the turning motor 21 to rotate the rotatable platform 19 by 180 degrees in the pick up travel control.

In the pick up transfer control, the controller H causes the support body 17 to be projected to the projected position (state shown in FIG. 6 with dashed lines), then causes the vertically movable member 14 to be raised to the unloading vertical stop position that corresponds to the transport origin (the state shown in FIG. 5 with dashed lines), and subsequently controls the operations of the vertical movement motor 14*a* and the projecting and retracting motor 20 to retract the support body 17 to the retracted position (the state shown in FIG. 5 with solid lines). The container W located at the transport origin is transferred onto the support body 17 as a result of the controller H performing these pick up travel control and pick up transfer control.

As shown in FIG. 5, in the unloading travel control, the controller H controls the operation of the travel motor 12*a* to cause the travel carriage 12 to the travel stop position that corresponds to the transport destination, and control the operation of the vertical movement motor 14*a* to vertically move the vertically movable member 14 to the unloading vertical stop position that corresponds to the transport destination. In addition, if and when the transfer device 15 is not in the orientation in which the transfer device 15 faces the transport destination, the controller H controls the operation of the turning motor 21 to rotate the rotatable platform 19 by 180 degrees in the unloading travel control.

In the unloading transfer control, after causing the support body 17 to be projected to the projected position (the state shown in FIG. 5 with dashed lines), the controller H causes the vertically movable member 14 to be lowered to the pick up vertical stop position that corresponds to the transport destination (the state shown in FIG. 6 with dashed lines), and subsequently controls the operations of the vertical movement motor 14*a* and the projecting and retracting motor 20 to retract the support body 17 to the retracted position (the state shown in FIG. 6 with solid lines). The container W located on the support body 17 of the transfer device 15 is transferred to the transport destination as a result of the controller H performing these unloading travel control and unloading transfer control.

Provided in a wall K are an opening and closing door (not shown) for a worker to enter the travel path, along which the stacker crane 3 travels, from the outside, and an opening-and-closing sensor S for detecting the opened or closed state of the opening and closing door. If and when the open state of the opening and closing door is detected by the opening-and-closing sensor S while the article transport control is being performed, the controller H is configured, based on the detected information from the opening-and-closing sensor S, to interrupt the article transport control and to perform an emergency stop control which causes the stacker crane 3 to make an emergency stop.

And it is possible for the container W to fall from the transfer device 15 if and when the stacker crane 3 makes an emergency stop in this manner, and especially when the stacker crane 3 makes an emergency stop while the vertically movable member 14 is being moved vertically during a performance of the pick up travel control or the unloading travel control. In order to prevent such a fall and/or to alleviate the shock or impact to the container W, each positioning member 9 of the transfer device 15 has an ingenious structure and a cushion member 29 is provided to the transfer device 15. More specifically, as shown in FIGS. 3 and 4, each positioning member 9 which receives and supports the container W in the transfer device 15 of the stacker crane 3 is configured to be elastically deformable in the vertical direction. When an object is described to be "elastically deformable in the vertical direction" in the present specification, it means that at least a part or portion of the object can change shape or dimension elastically and vertically under stress. In addition, as shown in FIGS. 5-9, a cushion member 29 is provided so as to be located above the container W received and supported by the positioning members 9. These positioning members 9 and the cushion member 29 are described next.

The support body 17 of the transfer device 15 includes the positioning members 9 which are elastically deformable in the vertical direction and is configured to receive and support a container W with the positioning members 9. More specifically, as shown in FIG. 2, the support body 17 has a base member 24 which is connected to the distal end portion of the linkage mechanism 18 and is moved along the projecting and retracting direction by the projecting and retracting motor 20, and the positioning members 9 which function as support members supported by the base member 24 such that the positioning members 9 project upwardly from the base member 24. The positioning members 9 are provided at three locations on the support body 17 that correspond to the locations of the bottom surface recessed portions 8 of the container W.

As shown in FIGS. 3 and 4, each positioning member 9 includes an engaging portion 25 which engages from below the corresponding bottom surface recessed portion 8 of the container W, an elastic portion 26 which is interposed between the engaging portion 25 and the base member 24 such that the elastic portion 26 can expand and contract along the vertical direction, and a cushion portion 27 which is interposed between the positioning member 9 and the base member 24 such that the cushion portion 27 can expand and contract along the vertical direction. The engaging portion 25 includes an insert portion 25*a* which is inserted into a through hole 24*a* formed in the base member 24, an engaging support portion 25*b* located above the top surface of the base member 24 and having a diameter that is greater than that of the through hole 24*a*, and a stopper portion 25*c* located below the undersurface of the base member 24 and having a diameter that is greater than that of the through hole 24*a*.

And the elastic portion 26 is provided in a compressed state in the vertical direction between the top surface of the base member 24 and the undersurface of the engaging support portion 25*b* such that the elastic portion 26 urges the engaging portion 25 upwardly. This elastic portion 26 consists of a plurality of disk springs stacked vertically on top of each other. In addition, the cushion portion 27 is provided between the undersurface of the base member 24 and the top surface of the stopper portion 25*c* to alleviate the shock or impact that may occur when the elastic portion 26 raises or expands relative to the base member 24 by the urging force. This cushion portion 27 consists of a ring-shaped elastic member (for example, urethane rubber).

As shown in FIGS. 5-9, the cushion member 29 is supported by a frame 30 which stands erect on the vertically movable member 14 and is provided to the vertically movable member 14 such that the cushion member 29 is spaced apart upwardly by a set distance L1 from the container W received and supported by the positioning members 9. As such, the cushion member 29 is provided to the vertically movable member 14 such that the cushion member 29 moves integrally with the vertically movable member 14. The cushion member 29 is formed to have a shape of a thin plate and is oriented to extend horizontally. The undersurface of the cushion member 29 is formed to have a flat surface so as to conform in shape to the uppermost surface of the container W. This cushion member 29 consists of a porous elastic member with relatively small relative density (for example, silicon sponge).

The set distance L1 (see FIG. 7) is set to be less than an insert length L2 (see FIG. 3) which is the vertical length of the portion, of the positioning member 9 engaging the bottom surface recessed portion 8, that is inserted into the bottom surface recessed portion 8 when the container W is supported by the positioning members 9. Note that the set distance L1 is set under the condition in which the container W is heaviest, and is set, in the case of a FOUP, when the container W carries the full load of semiconductor substrates. The positioning members 9 retract to the greatest degree under a condition in which the container W is heaviest. Therefore, when that happens, the distance (which corresponds to the set distance L1) between the upper end of the container W that is supported by the positioning members 9 and the cushion member 29 takes on the largest value. The set distance L1 is set or defined so that the relationship "L1<L2" is satisfied even in this state.

Note that under the condition in which the container W is lightest, the positioning members 9 are expanded, or project, to a greater degree compared with when under the condition in which the container W is heaviest. Therefore, when that happens, the distance (which corresponds to the set distance L1) between the upper end of the container W that is supported by the positioning members 9 and the cushion member 29 takes on the smallest value. The set distance L1 is defined such that the container W and the cushion member 29 are spaced apart from each other even under this condition. In other words, the set distance L1 is defined such that the container W that is supported by the positioning members 9 and the cushion member 29 are spaced apart from each other under the condition in which the container W is lightest, and such that the relationship "L1<L2" is satisfied even under the condition in which the container W is heaviest.

As described above, when the container W is received and supported by the positioning members 9, the container W and the cushion member 29 are spaced apart from each other, or separated, by the set distance L1. Therefore, when the transfer device 15 projects and retracts the support body 17 between the projected position and the retracted position, the container W received and supported by the support body 17 does not contact the cushion member 29.

As such, the transfer device 15 is provided with the positioning members 9 for receiving and supporting the container W that are configured to be elastically deformable in the vertical direction as well as the cushion member 29 so located to be above the container W received and supported by the positioning members 9. Thus, for example, when the vertically movable member 14 makes an emergency stop during its ascent, the following happens.

Figure 7:
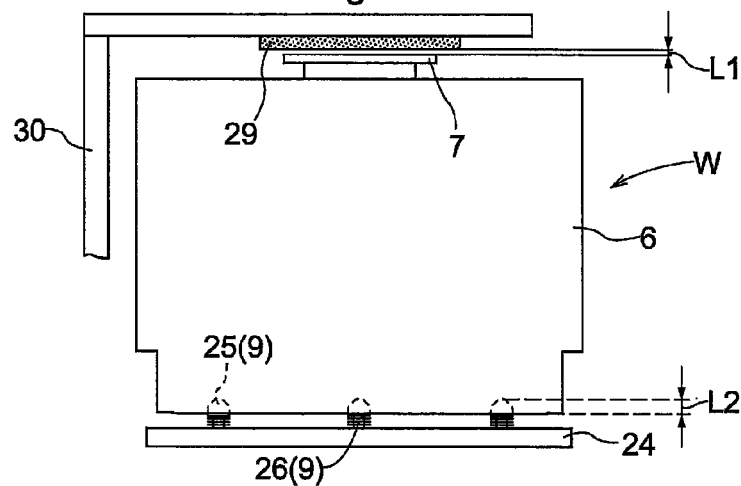
FIG. 7 shows how the container behaves when the vertically movable member makes an emergency stop (in a normal situation)

First, when the vertically movable member 14 is raised at the usual acceleration and deceleration and at the usual vertical movement speed under the pick up travel control or the unloading travel control, the container W is received and supported by the three positioning members 9 as shown in FIG. 7. During this time, the gap or space of at least the set distance L1 is maintained between the container W and the cushion member 29. During this time, as shown in FIG. 3, the three positioning members 9 are slightly contracted, relative to the top surface of the base member 24, from the state where they are extended to the greatest extent.

Figure 8:
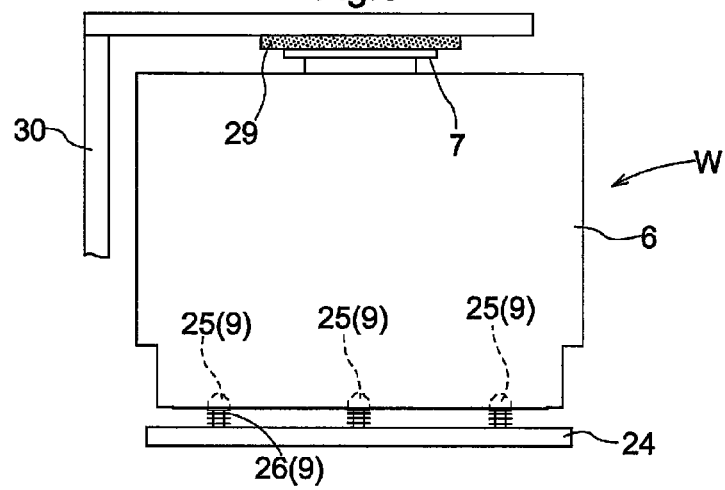
FIG. 8 shows how the container behaves when the vertically movable member makes an emergency stop (when the container is lifted)

If and when the emergency stop control is performed so that the vertically movable member 14 is decelerated at a greater deceleration than the usual deceleration, it may be possible for the container W to be lifted from the positioning members 9 (support members) due to inertia as shown in FIG. 8. When that happens, the container W that is lifted is received by the cushion member 29. Therefore, the shock received by the container W is reduced and the container W is prevented from falling from the positioning members 9 at the same time. When this happens, the positioning members 9 are extended to the greatest degree although these three positioning members 9 remain inserted in the bottom surface recessed portions 8 of the container W. As described above, the set distance L1 is defined such that "L1<L2" is satisfied. Therefore, even when the container W that is lifted is received by the cushion member 29, the positioning members 9 remain inserted in the bottom surface recessed portions 8.

Figure 9:
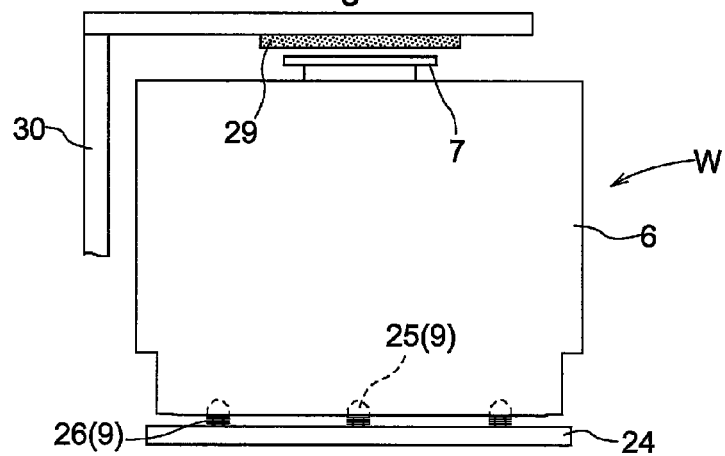
FIG. 9 shows how the container behaves when the vertically movable member makes an emergency stop (during a reaction)

Subsequently, as shown in FIG. 9, the container W comes back into contact with the positioning members 9 from being lifted from the positioning members 9 because of the elastic force of the cushion member 29 and gravity. In other words, the container W falls to the positioning members 9 as a reaction from the lifting. When this happens, the shock or the impact to the container W from this reaction can be alleviated or reduced since the container W is received by the positioning members 9 which can exert elastic force. Thus, even if the stacker crane 3 makes an emergency stop, the container W can be prevented from falling from the vertically movable member 14 and the strong shock or impact to the container W during the lifting or returning can be alleviated.

Note that the expression "the container W being lifted from the positioning members 9" means that the vertical distance between the lower ends of the positioning members 9 (the lower ends of the elastic portion 26) and the lower end of the container W becomes greater than the vertical distance between the lower ends of the positioning members 9 (the lower ends of the elastic portion 26) and the lower end of the container W when the container W is received and supported by the positioning members 9. Thus, since the positioning members 9 expand or are shifted upwardly as the container W is lifted from the positioning members 9, the upper end portion of the engaging portion 25 of each positioning member 9 may still be in contact with the bottom surface recessed portion 8 of the container W even when the container W is lifted from the positioning members 9.

Alternative Embodiments (1) In the embodiment described above, an example is described in which the support members are the positioning members 9 each formed in the shape of a pin. However, the arrangement for receiving and supporting the container W with the support member may be of any other configuration so long as it is elastically deformable in the vertical direction. For example, each support member may be a member having a plate-shaped support plate for receiving and supporting the entire bottom surface of the container W.

(2) In the embodiment described above, an example is described in which the set distance L1 is less than the insert length L2. However, the set length L1 may be the same as, or greater than, the insert length L2.

(3) In addition, the set distance L1 may be set or defined depending on the insert length L2 and the amount of vertical extension and contraction of the positioning members 9. In other words, when the container W is lifted from the positioning members 9, the positioning members 9 project or extend further upwardly with the lifting movement of the container W. And the set distance L1 may be set or defined to be the distance such that the lower ends of the bottom surface recessed portions 8 of the container W which is lifted are located lower than the upper ends of the positioning members 9 that have projected or extended upwardly when the container W which is lifted is received by the cushion member 29. In short, the set distance L1 only needs to be such a distance that the container W which is lifted contacts the cushion member 29; however, in order to prevent the container W from falling more reliably, the set distance L1 is preferably set or defined to be a distance such that the positioning members 9 remain inserted in the bottom surface recessed portions 8 when the container W which is lifted is received by the cushion member 29.

(4) In addition, in the embodiment described above, an example is described in which the resilience of the positioning members 9 are set or defined to be a force such that, when the container W is received and supported by the positioning members 9, the positioning members 9 are in an intermediate state between the state in which the positioning members 9 extend to the greatest degree and the state in which the positioning members 9 contract to the greatest degree. However, the resilience of the positioning members 9 may be set or defined to be a force such that, when the container W is received and supported by the positioning members 9, the positioning members 9 are in the state in which the positioning members 9 extend to the greatest degree or in the state in which the positioning members 9 contract to the greatest degree.

(5) In the embodiment described above, the cushion member 29 is formed to have a shape that conforms to the uppermost surface of the container W. However, the cushion member may be formed to have a shape that conforms to a top surface other than the uppermost surface of the article. For example, the cushion member 29 may be formed to have a portion that fits into the top surface recessed portion 10 and to have a shape that conforms to the upper surface of the flange portion 7 of the container W. Or the cushion member 29 may be formed to have a shape that conforms to the top surface of the container main body portion 6 of the container W.

(6) In the embodiment described above, the elastic portion 26 consists of a plurality of disk springs. However, the elastic portion 26 may be other elastic member, such as a coil spring or a silicon sponge. In addition, while the cushion member 29 is a silicon sponge in the embodiment described above, the cushion member 29 may be other elastic members, such as a rubber sheet or a coil spring. Also, in the embodiment described above, each positioning member 9 includes the base member 24, the engaging portion 25, and the elastic portion 26 such that each positioning member 9 is elastic, or is capable of extending and contracting, in the vertical direction. The entire positioning member 9 may be an elastic member, such as rubber so that each positioning member 9 is elastic, or is capable of extending and contracting, in the vertical direction.

(7) In the embodiment described above, the article is a FOUP. However, the article may be other types of container such as a bulk container or a carton case.

A brief summary of the article transport facility described above is given next.

In one embodiment, an article transport facility comprises: an article transport device for transporting articles among a plurality of transfer target locations arranged in a vertical direction, wherein the article transport device includes a vertically movable member which is movable along the vertical direction, and a transfer device which is supported by the vertically movable member and is configured to transfer an article to or from any one of the transfer target locations, wherein the transfer device includes a support body for receiving and supporting an article, and a projecting and retracting actuator for projecting and retracting the support body between a projected position in which the support body is projected toward the any one of the transfer target location and a retracted position in which the support body is retracted toward the vertically movable member, wherein the support body includes a support member which is elastically deformable in the vertical direction, wherein the support body is configured to receive and support an article with the support member, and wherein a cushion member which is elastically deformable in the vertical direction is provided to the vertically movable member such that the cushion member is spaced apart upwardly by a set distance from an article which is received and supported by the support member.

With the arrangement described above, even when the article is lifted from the support member, the lifted article is received in a cushion member; thus, lifting of the article by more than a set distance can be prevented. Thus, the article can be prevented from falling from the support member by reducing the lifting of the article from the support member in this manner. In addition, since the cushion member is configured to be elastically deformable in the vertical direction, any shock or impact that may occur when the article is received by the cushion member can be alleviated. And although the article received by the cushion member subsequently falls on the support member due to gravity, any shock or impact that may occur when the article is received by the support member can be alleviated because the support member which receive the article are configured to be elastically deformable in the vertical direction.

In addition, the cushion member is spaced apart upwardly by the set distance from the article received and supported by the support member. In other words, space or a gap is provided so that the article would not contact the cushion member; thus, when transferring the article with the transfer device, the article can be transferred while avoiding contact between the article and the cushion member without having to retract the cushion member upwardly. As such, it becomes easy to smoothly perform transfer of an article with transfer device since the article can be transferred with the transfer device without having to vertically move the cushion member, while preventing the article falling from the support member by preventing a lifting of the article by more than the set distance.

Here, the support body preferably includes a base member which is projected and retracted by the projecting and retracting actuator, wherein the support member is preferably provided to the support body so as to project upwardly from the base member, and wherein the support member preferably includes an engaging portion for engaging, from below, a recessed portion formed in an undersurface of an article and having a shape that is recessed upwardly, and an elastic portion interposed between the engaging portion and the base member such that the elastic portion can expand and contract in the vertical direction to urge the engaging portion upwardly.

With the arrangement described above, the support member is elastically deformed in the vertical direction because the elastic portion which is interposed between the engaging portion and the base member expands and contracts in the vertical direction. Thus, the engaging portion of the support member does not have to be configured to elastically deform in the vertical direction. And so, it becomes easy to receive and support the article with the support member with sufficient stability by constructing the engaging portion to be rigid and by causing the rigid engaging portion to engage with the recessed portion to receive and support the article. In addition, because the engaging portion of the support member engages the recessed portion from below, any horizontal displacement of the article can be restricted by the support member; thus, the article can be received and supported by the support member with sufficient stability in this regard also.

In addition, the set distance is preferably set to be less than an insert length which is a vertical length of a portion, of the engaging portion engaging the recessed portion, that is inserted into the recessed portion when the article is received and supported by the support member.

With the arrangement described above, since the set distance is set or defined to be less than the insert length, if and when the article is lifted from the support member and comes into contact with the cushion member, a part of engaging portion including its upper end still remains inserted within the recessed portion. Thus, even when the article is lifted from the support member, any horizontal displacement of the article can be restricted by the support member because of the contact of the part of engaging portion including its upper end against the recessed portion; thus, the article can be reliably prevented from falling from the support member.

In addition, the set distance is preferably set to a length such that an upper end of the article received and supported by the support member and a lower end of the cushion member are spaced apart from each other under a condition in which the article is lightest, and is set to be less than the insert length under a condition in which the article is heaviest.

The support member (the engaging portion in particular) is extended or projected to a greater degree under the condition in which the articles is lightest compared with under the condition in which the articles is heaviest. Therefore, the distance (which corresponds to the set distance) between the upper end of the article received and supported by the support member and the cushion member becomes shortest when this happens. Because the set distance is set or defined such that the article and the cushion member are spaced apart from each other even under this condition, the gap between the upper end of the article and the cushion member can be reliably formed even if the article is light in weight. In addition, since the set distance is set or defined to be shorter than the insert length as described above, even when the article is lifted from the support member and comes into contact with the cushion member, a part of the engaging portion remains inserted within the recessed portion.

In addition, an undersurface of the cushion member is preferably formed to have a shape that conforms to a top surface of the article.

With the arrangement described above, when the article is lifted from the support member, the top surface of the article would have a surface-to-surface contact with the undersurface of the cushion member when the lifted article is received by the cushion member; thus, any change in the attitude of the article which may occur when the article is received by the cushion member can be reduced to the extent possible.

In addition, an uppermost surface of the article is preferably formed to be a flat surface, and wherein the cushion member is formed to be plate-shaped, and is provided to the vertically movable member in an attitude such as to extend along the uppermost surface of the article received and supported by the said support body.

With the arrangement described above, the cushion member formed to be plate-shaped only needs to be provided to the vertically movable member in the attitude such as to extend along the uppermost surface of the article received and supported by the support member, thus; the cushion member can be easily formed and easily installed.

What is claimed is:

1. An article transport facility comprising:
an article transport device for transporting articles among a plurality of transfer target locations arranged in a vertical direction,
wherein the article transport device includes a vertically movable member which is movable along the vertical direction, and a transfer device which is supported by the vertically movable member and is configured to transfer an article to or from any one of the transfer target locations,
wherein the transfer device includes a support body for receiving and supporting an article, and a projecting and retracting actuator for projecting and retracting the support body between a projected position in which the support body is projected toward the any one of the transfer target location and a retracted position in which the support body is retracted toward the vertically movable member,
wherein the support body includes a support member which is elastically deformable in the vertical direction to change shape or dimension elastically and vertically under stress, wherein the support body is configured to receive and elastically support an article with the support member from below the article, and
wherein a cushion member which is elastically deformable in the vertical direction is provided to the vertically movable member such that the cushion member is spaced apart upwardly by a set distance from an article which is received and supported by the support member.

2. The article transport facility as defined in claim 1, wherein:
the support body includes a base member which is projected and retracted by the projecting and retracting actuator,
wherein the support member is provided to the support body so as to project upwardly from the base member, and
wherein the support member includes an engaging portion for engaging, from below, a recessed portion formed in an undersurface of an article and having a shape that is recessed upwardly, and an elastic portion interposed between the engaging portion and the base member such that the elastic portion can expand and contract in the vertical direction to urge the engaging portion upwardly.

3. The article transport facility as defined in claim 2, wherein
the set distance is set to be less than an insert length which is a vertical length of a portion, of the engaging portion engaging the recessed portion, that is inserted into the recessed portion when the article is received and supported by the support member.

4. The article transport facility as defined in claim 3, wherein
the set distance is set to a length such that an upper end of the article received and supported by the support member and a lower end of the cushion member are spaced apart from each other under a condition in which the article is lightest, and is set to be less than the insert length under a condition in which the article is heaviest.

5. The article transport facility as defined in claim 2, wherein
an undersurface of the cushion member is formed to have a shape that conforms to a top surface of the article.

6. The article transport facility as defined in claim 5, wherein
an uppermost surface of the article is formed to be a flat surface, and
wherein the cushion member is formed to be plate-shaped, and is provided to the vertically movable member in an attitude such as to extend along the uppermost surface of the article received and supported by the said support body.

7. The article transport facility as defined in claim 3, wherein
an undersurface of the cushion member is formed to have a shape that conforms to a top surface of the article.

8. The article transport facility as defined in claim 7, wherein
an uppermost surface of the article is formed to be a flat surface, and
wherein the cushion member is formed to be plate-shaped, and is provided to the vertically movable member in an attitude such as to extend along the uppermost surface of the article received and supported by the said support body.

9. The article transport facility as defined in claim 4, wherein
an undersurface of the cushion member is formed to have a shape that conforms to a top surface of the article.

10. The article transport facility as defined in claim 9, wherein
an uppermost surface of the article is formed to be a flat surface, and
wherein the cushion member is formed to be plate-shaped, and is provided to the vertically movable member in an attitude such as to extend along the uppermost surface of the article received and supported by the said support body.

11. The article transport facility as defined in claim 1, wherein
an undersurface of the cushion member is formed to have a shape that conforms to a top surface of the article.

12. The article transport facility as defined in claim 11, wherein
an uppermost surface of the article is formed to be a flat surface, and
wherein the cushion member is formed to be plate-shaped, and is provided to the vertically movable member in an attitude such as to extend along the uppermost surface of the article received and supported by the said support body.

13. The article transport facility as defined in claim 1, wherein
the support member by which the article is received and supported expands or is shifted upwardly as the article is lifted in the vertical direction.

14. The article transport facility as defined in claim 13, wherein
resilience of the support member is set to be a force such that, when the article is received and supported by the support member, the support member is in an intermediate state between a state in which the support member extends to the greatest degree under a condition in which the article is lightest, and a state in which the support member contracts to the greatest degree under a condition in which the article is heaviest.

15. The article transport facility as defined in claim 14, wherein
the support body includes a base member which is projected and retracted by the projecting and retracting actuator,
wherein the support member is provided to the support body so as to project upwardly from the base member, and
wherein the support member includes an engaging portion for engaging, from below, a recessed portion formed in an undersurface of an article and having a shape that is recessed upwardly, and an elastic portion interposed between the engaging portion and the base member such that the elastic portion can expand and contract in the vertical direction to urge the engaging portion upwardly.

16. The article transport facility as defined in claim 15, wherein
the set distance is set to be less than an insert length which is a vertical length of a portion, of the engaging portion engaging the recessed portion, that is inserted into the recessed portion when the article is received and supported by the support member.

17. The article transport facility as defined in claim 16, wherein
the set distance is set to a length such that an upper end of the article received and supported by the support member and a lower end of the cushion member are spaced apart from each other under a condition in which the article is lightest, and is set to be less than the insert length under a condition in which the article is heaviest.

18. The article transport facility as defined in claim 17, wherein
an undersurface of the cushion member is formed to have a shape that conforms to a top surface of the article.

19. The article transport facility as defined in claim 18, wherein
an uppermost surface of the article is formed to be a flat surface, and
wherein the cushion member is formed to be plate-shaped, and is provided to the vertically movable member in an attitude such as to extend along the uppermost surface of the article received and supported by the said support body.

* * * * *